United States Patent
Burrows (10) Patent No.: US 7,192,480 B2
(45) Date of Patent: Mar. 20, 2007

(54) ION EXCHANGE WAVEGUIDES AND METHODS OF FABRICATION

(75) Inventor: Lee J. Burrows, San Francisco, CA (US)

(73) Assignee: California Institute of Technology, Pasadena, CA (US)

( * ) Notice: Subject to any disclaimer, the term of this patent is extended or adjusted under 35 U.S.C. 154(b) by 88 days.

(21) Appl. No.: 10/919,695

(22) Filed: Aug. 16, 2004

(65) Prior Publication Data

US 2005/0115491 A1   Jun. 2, 2005

Related U.S. Application Data

(60) Division of application No. 09/419,347, filed on Oct. 15, 1999, now Pat. No. 6,786,967, which is a continuation-in-part of application No. 09/309,361, filed on May 11, 1999, now Pat. No. 6,770,132.

(60) Provisional application No. 60/084,940, filed on May 11, 1998.

(51) Int. Cl.
    C30B 1/02        (2006.01)
(52) U.S. Cl. .............................. 117/2; 117/3; 427/53.1
(58) Field of Classification Search .............. 117/2, 117/3; 427/53.1
    See application file for complete search history.

(56) References Cited

U.S. PATENT DOCUMENTS

| 4,196,963 A | 4/1980 | Chen et al. ............... 350/96.12 |
| 4,640,736 A | 2/1987 | Holman ....................... 156/603 |
| 5,064,684 A | 11/1991 | Mir et al. ................... 427/53.1 |

(Continued)

FOREIGN PATENT DOCUMENTS

EP    0 635 735    6/1994

(Continued)

OTHER PUBLICATIONS

Nagata, et al. "Reduced thermal decomposition of OH-free $LiNbO_3$ substrates even in a dry gas atmosphere," Journal of Materials Research, Aug. 1996, Mater. Res. Soc., USA, vol. 11, No. 8, pp. 2085-2091.

(Continued)

*Primary Examiner*—Felisa Hiteshew
(74) *Attorney, Agent, or Firm*—Thelen Reid Brown Raysman & Steiner LLP; David B. Ritchie (57) ABSTRACT

A method for fabricating ion exchange waveguides, such as lithium niobate or lithium tantalate waveguides in optical modulators and other optical waveguide devices, utilizes pressurized annealing to further diffuse and limit exchange of the ions and includes ion exchanging the crystalline substrate with a source of ions and annealing the substrate by pressurizing a gas atmosphere containing the lithium niobate or lithium tantalate substrate above normal atmospheric pressure, heating the substrate to a temperature ranging from about 150 degrees Celsius to about 1000 degrees Celsius, maintaining pressure and temperature to effect greater ion diffusion and limit exchange, and cooling the structure to an ambient temperature at an appropriate ramp down rate. In another aspect of the invention a powder of the same chemical composition as the crystalline substrate is introduced into the anneal process chamber to limit the crystalline substrate from outgassing alkaline earth metal oxide during the anneal period. In yet another aspect of the invention an anneal container is provided that allows for crystalline substrates to be annealed in the presence of powder without contaminating the substrate with the powder during the anneal process. Waveguides manufactured in accordance with the method exhibit superior drift performance.

50 Claims, 4 Drawing Sheets

U.S. PATENT DOCUMENTS

| | | | |
|---|---|---|---|
| 5,095,518 A | 3/1992 | Young et al. | 385/130 |
| 5,193,136 A | 3/1993 | Chang et al. | 385/129 |

FOREIGN PATENT DOCUMENTS

| | | |
|---|---|---|
| EP | 0 652 457 | 9/1994 |
| WO | WO99/63393 | 12/1999 |

OTHER PUBLICATIONS

Kwiatkowski, et al. "Nearly cut-off modes caused by diffusion in lithium niobate," Journal of Applied Physics, vol. 76, No. 10, pt. 1, pp. 5877-5885, Nov. 15, 1994.

Nozawa, et al. "Water Vapor Effects on Titanium Diffusion into $LiNbO_3$ Substrates," Japanese Journal of Applied Physics, vol. 29, No. 10, pp. 2180-2185, Oct. 1, 1990.

ION EXCHANGE WAVEGUIDES AND METHODS OF FABRICATION

CROSS-REFERENCE TO RELATED APPLICATION

This is a divisional of U.S. patent application Ser. No. 09/419,347, filed Oct. 15, 1999, now U.S. Pat. No. 6,786,967 and entitled. "Ion Exchange Waveguides and Methods of Fabrication", by inventor Lee J. Burrow, which is a continuation-in-part of U.S. patent application Ser. No. 09/309,361, filed May 11, 1999, now U.S. Pat. No. 6,770,132, and entitled, "Method for Pressurized Annealing of Lithium Niobate and Resulting Lithium Niobate Structures", by inventor Lee J. Burrows assignor to California Institute of Technology, a California non-profit corporation. Patent application Ser. No. 09/309,361 claims the benefit of provisional patent application Ser. No. 60/084,940 filed May 11, 1998, and entitled "Pressurized Annealing of Lithium Niobate". This application is also related to U.S. patent application Ser. No. 09/418,725, now U.S. Pat. No. 6,770,132, filed Oct. 15, 1999, entitled "TITANIUM-INDIFFUSION WAVEGUIDES AND METHODS OF FABRICATION" by inventors Lee J. Burrows and William B. Bridges, both assignors to the California Institute of Technology; and U.S. patent application Ser. No. 09/419,349, filed on Oct. 15, 1999, entitled "TITANIUM-INDIFFUSION WAVEGUIDES" by inventor Lee J. Burrows, assignor to the California Institute of Technology; and U.S. patent application Ser. No. 09/157,652, now U.S. Pat. No. 6,518,078, filed Sep. 21, 1998 entitled "ARTICLES USEFUL AS OPTICAL WAVEGUIDES AND METHOD FOR MANUFACTURING SAME" by inventor Lee J. Burrows, assignor to the California Institute of Technology.

STATEMENT AS TO RIGHTS TO INVENTIONS

The United States Government has certain rights in this invention pursuant to Grant No. F-19628-95-C-0002 awarded by the United States Air Force.

BACKGROUND OF THE INVENTION

1. Field of the Invention

The present invention relates to a method for fabricating ion exchange waveguides in optical modulators using pressurized annealing and the resulting waveguides and modulators. More particularly, the present invention relates to a method for fabricating lithium niobate-ion or lithium tantalate-ion exchange waveguides using a pressurized oxygen atmosphere anneal process to further diffuse ions in the exchange region.

2. Background

Optoelectronic components can be fabricated on several types of substrates including polymers, glass, semiconductors (e.g., gallium arsenide (GaAs) and indium phosphide (InP)) and inorganic materials (e.g., lithium niobate ($LiNbO_3$) and lithium tantalate ($LiTaO_3$)). Characteristically, an electro-optic material is one in which the index of refraction changes with the application of an electric field. One of the most important components in optoelectronic systems is the modulator. Three competing technologies in this realm are: direct modulation of a semiconductor laser, semiconductor electro-absorption modulators, and the lithium niobate modulator. Currently, lithium niobate modulators are the modulation devices of choice for many systems because they yield high performance, are a relatively mature technology and other modulation schemes impose limits not faced with lithium niobate modulators.

Lithium niobate has proven to be a suitable medium for components such as amplitude modulators, phase modulators, optical switches, polarization transformers, tunable filters and wavelength-selective optical add/drop filters. Lithium niobate has also been used as the host for solid state lasers using rare earth ions, e.g., erbium. Most current telecommunication and cable television system applications for $LiNbO_3$ modulators involve discrete components for the optical transmitter subsystem. This configuration couples continuous wave lasers, typically diode-pumped YAG or erbium fiber oscillators, with lithium niobate external modulators and various wavelength and power stabilization components.

Lithium niobate is a popular nonlinear optical crystal for several reasons including its large electro-optic coefficients, the ease with which high quality optical waveguides are fabricated and its amenability to conventional integrated circuit processing techniques. High quality optical waveguides are those that possess low loss and relatively high power handling capabilities. Additionally, $LiNbO_3$ is a hard material, thus it is easily polished for fiber optical coupling which makes its use in optical network systems relatively uncomplicated. It is also a relatively inexpensive crystal, due in part to its long history of use in surface-acoustic-wave (SAW) filters for radio frequencies. By comparison, lithium tantalate $LiTaO_3$ is essentially interchangeable with lithium niobate as far as modulator characteristics are concerned, but the use of $LiTaO_3$ is often cost prohibitive because it is not as widely commercially used as $LiNbO_3$. Additionally, other optical crystalline structures having the formula $RMO^3$, where R is an alkaline earth metal, M is a Group IVB or Group VB metal, and O is oxygen, can also be used in the fabrication of waveguides and modulators.

For example, one type of modulator incorporating the use of $LiNbO_3$ is a Mach-Zehnder modulator. In a Mach-Zehnder modulator an incoming optical beam is split equally at a Y junction into two parallel waveguides, which then recombine at another Y junction after some distance. Electrodes are used to apply an electric field in the region of the optical waveguides. The electric field causes a relative phase shift between the two branches. If the phase shift in both arms is the same, then the two optical signals will recombine constructively at the second Y branch and no optical power will be lost. If there is a phase difference between the two arms, then there will be destructive interference and some optical power will be lost. The resulting destructive and constructive interference causes the output optical intensity to vary between a minimum and a maximum value.

In other electro-optic applications optical waveguide directional couplers can also be used as electro-optic modulators. In this type of modulator two waveguides are placed on the lithium niobate substrate in very close proximity to one another. The wave from one guide can "leak" into the other guide. By applying an electric field to the lithium niobate, the amount of "leakage" can be controlled, thus modulating the transfer of power from one guide to the other. Currently, different commercial application requirements favor either directional couplers or Mach-Zehnder modulators.

The advance of high-speed, large bandwidth, digital and analog communications has led to a demand for the external modulator configuration. The most common approach utilizes a low-noise, high power diode-pumped laser whose signal is sent to the $LiNbO_3$ modulator via optical fiber. The modulator applies either analog or digital information to the optical carrier.

When using lithium niobate in the fabrication of optical waveguides and optical modulators it is desired to avoid having a niobium-rich, lithium-poor and/or oxygen poor composition. When bulk lithium niobate has such niobium rich-compositions, and is then processed at high temperatures (T>300 degrees Celsius), growth of the $LiNb_3O_8$ phase in the crystal may occur. This phase is undesirable because it is not optically transparent and leads to high losses in optical waveguides and optical modulators.

Such niobium-rich compositions can occur in two different manners during fabrication of optical waveguides and optical modulators. First, typical ion exchange procedures result in the replacement of lithium atoms in the crystal lattice with a diffusing ion leading to a lithium niobate composition relatively rich in niobium. Second, standard high temperature (temperatures in excess of 300 degrees Celsius) processing of lithium niobate can cause $Li_2O$ out-diffusion, and result in niobium-rich, and lithium and oxygen poor compositions.

To eliminate the undesired $LiNb_3O_8$ phase from forming in the crystal, high temperature processing, such as the stress relieving anneal process, is usually performed in a wet atmosphere of inert carrier gas, such as nitrogen ($N_2$) or argon ($Ar_2$), or in a wet atmosphere of oxygen ($O_2$). This type of anneal process involves bubbling the inert carrier gas or oxygen gas through water ($H_2O$). The wet atmosphere has been considered beneficial in the past because the $H_2O$ breaks down into $H^+$ and $OH^-$ ions which chemically attack the $LiNb_3O_8$ phase and break it back down into $LiNbO_3$. A typical wet atmosphere anneal operation is performed at a temperature of about 350 degrees Celsius for a period of 5 to 6 hours in a wet, flowing environment. The present inventor has discovered that a drawback of this type of high temperature processing is that the $H_2O$ gives off undesirable protons ($H^+$) which are attracted by the lithium niobate and result in an inadvertent proton-exchanged surface layer occurring. These protons remain in the modulators after fabrication and flow relatively freely among the waveguides, the electrodes, the lithium niobate crystal and the buffer layer interface. It is now understood that these free flowing protons can and do adversely affect a modulator's DC-bias stability because they act as charge carriers and are driven by the applied electric fields, causing the response of the final product to drift over time when a bias is applied.

Additionally, high temperature processing (>300 degrees Celsius) leads to oxygen out-diffusion of lithium niobate structures. This out-diffusion tends to form a surface layer on a lithium niobate substrate or a lithium niobate waveguide that is oxygen poor in composition. This oxygen poor region acts as a surface optical waveguide and causes undesirable leakage of light out of the lithium niobate substrate.

Ion exchange waveguides have typically been fabricated by treating or exchanging the surface of the crystalline substrate with a source of ions. In most applications the exchanging has been performed with protons in the form of an acid, such as sulfuric acid or benzoic acid. The exchanging allows for the initial diffusion to take place, resulting in up to about 50% ion exchange (i.e., the ions replace the alkaline earth metal atoms in the crystal lattice). The initial exchanging process is then followed by a procedure that will further diffuse the ions and drive the diffusion region farther into the depth of the crystalline substrate. Ion exchange can also be accomplished by using alkaline earth metal salt (i.e., lithium salt) as a buffer to the exchanging acid. Salt treatments are inefficient because they are time prohibitive, some salt treatments can take upwards of 48 hours. Standard wet anneal processes introduce undesirable protons which are attracted by the crystalline substrate and result in an inadvertent proton exchanged surface layer occurring.

It would therefore be highly advantageous to devise a fabrication method for ion exchange waveguides that uses a new high temperature annealing process that inhibits both the formation of the undesirable $LiNb_3O_8$ phase in the crystal and outdiffusion of $O_2$ without the process introducing significant numbers of free flowing protons that will affect the modulator's DC-bias stability.

BRIEF DESCRIPTION OF THE INVENTION

A method for fabricating ion exchange waveguides, such as lithium niobate or lithium tantalate waveguides in optical modulators and other optical waveguide devices, utilizes pressurized annealing to further diffuse and limit exchange of the ions and includes ion exchanging the crystalline substrate with a source of ions and annealing the substrate by pressurizing a gas atmosphere containing the lithium niobate or lithium tantalate substrate above normal atmospheric pressure, heating the substrate to a temperature ranging from about 150 degrees Celsius to about 1000 degrees Celsius, maintaining pressure and temperature to effect greater ion diffusion and limit exchange, and cooling the structure to an ambient temperature at an appropriate ramp down rate. In another aspect of the invention a powder of the same chemical composition as the crystalline substrate is introduced into the anneal process chamber to limit the crystalline substrate from outgassing alkaline earth metal oxide during the anneal period. In yet another aspect of the invention an anneal container is provided that allows for crystalline substrates to be annealed in the presence of powder without contaminating the substrate with the powder during the anneal process. Waveguides manufactured in accordance with the method exhibit superior drift performance.

DETAILED DESCRIPTION OF THE PRESENT INVENTION

Those of ordinary skill in the art will realize that the following description of the present invention is illustrative only and is not intended to be in any way limiting. Other embodiments of the invention will readily suggest themselves to such skilled persons from an examination of the within disclosure.

In accordance with one presently preferred embodiment of the present invention a method is provided for fabricating an ion exchange lithium niobate (LiNbO$_3$) optical modulator. Pressurized annealing is used to further diffuse ions in the waveguide as is detailed below. Ion exchange fabrication involves altering one or more refractive indices (e.g., the extraordinary and ordinary refractive indices) of the crystal substrate in the region where the ion diffusion occurs to create an optical waveguide. The following exemplary description of the modulator fabrication process is intended to limit the introduction of undesirable free protons into the fabrication process. FIGS. 1A–1G are cross sectional views of a modulator after completion of selected steps in the fabrication process.

The present invention may also be defined as a method for fabricating an ion exchange lithium tantalate (LiTaO$_3$) optical modulator. Lithium tantalate is closely related in terms of electro-optical properties to LiNbO$_3$ but is not currently widely used in commercial electro-optical modulator applications because to do so would be cost prohibitive. The same or similar pressurized anneal process as described below for LiNbO$_3$ would be employed in the annealing of LiTaO$_3$. Additionally, the crystal substrate that is used to form the optical modulator may be formed from a crystalline structure having the formula RMO$_3$, where R is an alkaline earth metal, M is a Group IVB or Group VB metal, and O is oxygen.

Figure 1A:
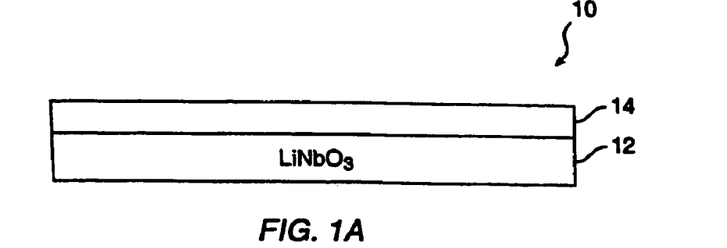
FIGS. 1A–1G are cross-sectional views of various stages in the fabrication of a lithium niobate ion exchange optical modulator that incorporates pressurized oxygen atmosphere annealing in accordance with a one embodiment of the present invention.

Referring to FIG. 1A, a modulator build 10 (a partially fabricated modulator) is shown after the formation of a mask layer 14 over the LiNbO$_3$ crystal substrate 12. The mask layer 14 may comprise silicon oxide (SiO$_2$), chromium oxide (Cr$_2$O$_3$), aluminum oxide (Al$_2$O$_3$) or another suitable masking layer material. Preferably, the mask material should be robust enough to withstand exposure to acids conceivably introduced in later processing. The use of such masking layer materials are well known by those of ordinary skill in the art. Mask layer 14 may be formed by using conventional plasma deposition, sputtering or thermal evaporation techniques, all of which are well known by those of ordinary skill in the art.

Figure 1B:
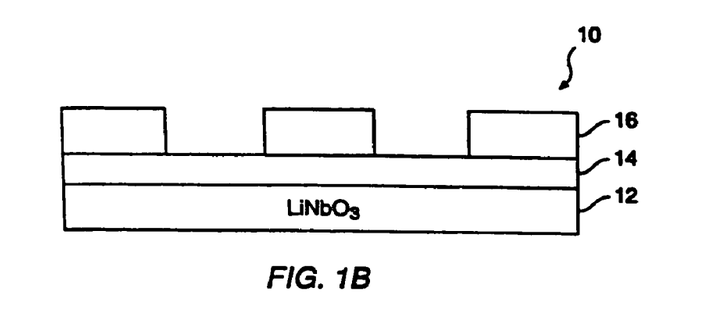

In FIG. 1B, standard photolithography techniques are used to place a photo resist layer 16 over the mask layer 14. As shown in FIG. 1B the photolithography process will result in the formation of channels in the photoresist in those areas where waveguides are to be fabricated. The use of such photolithography techniques are well known by those of ordinary skill in the art.

Figure 1C:
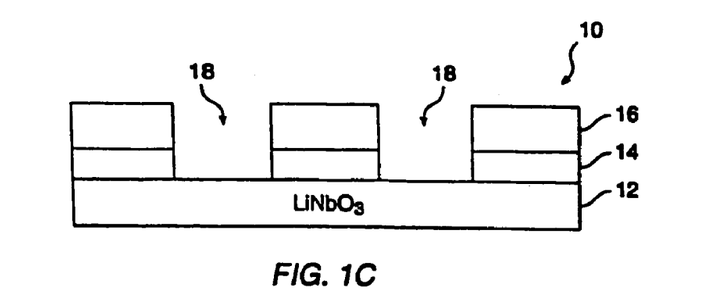

Referring to FIG. 1C a conventional plasma etch or reactive ion etch (RIE) technique is preferably then employed to form channels 18 through the mask layer 14 exposing the LiNbO$_3$ crystal substrate 12. The channel widths can be of a dimension suitable for the intended wavelength of the constrained wave. For example, for a 1.3 micron Optical Signal channel widths of from about 5 microns to about 7 microns are presently preferred. A plasma etch or RIE procedure is preferably chosen so that it selectively etches away the material chosen as mask layer 14. It should be noted that the etch process should preferably avoid wet etching. Wet etching generally involves the use of acids and thus would generally be likely (unless deuterated acids are used) to introduce free protons into the waveguide scheme that would adversely affect the LiNbO$_3$. As previously discussed, free protons in the waveguide tend to increase the likelihood of output voltage drift over time.

Once the plasma etch or RIE process is completed it may be desirable to strip away residual photoresist. However, in some instances the photoresist will be robust enough to withstand exposure to acidic materials and thus no stripping process needs to be employed. If an optional stripping process is used it may be accomplished with an oxygen plasma or by using an acetone wash. The use of acids for stripping purposes should be avoided as they have a tendency to introduce free protons into the modulator construct and these free protons increase the likelihood of latent drift in the modulators.

Figure 1D:
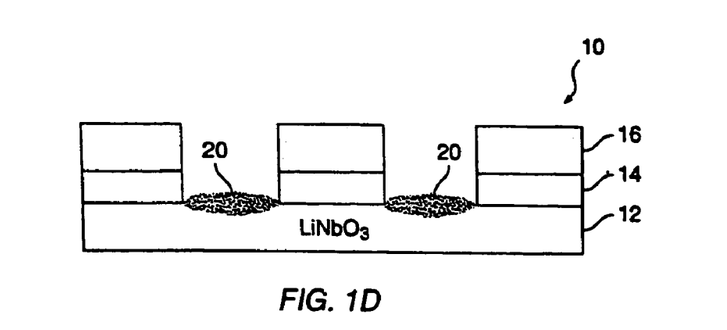

Referring to FIG. 1D, shown is the modulator build 10 after undergoing initial ion exchange diffusion. The exposed LiNbO$_3$ crystal substrate 12 is treated with an acid, preferably a deuterated acid, such as deuterated sulfuric acid (D$_2$SO$_4$), deuterated benzoic acid (C$_7$D$_6$O$_2$) or another suitable deuterated acid. Deuterated sulfuric acid may be obtained in pure concentration from the Alfa Aesar Corporation of Ward Hill, Mass. and other vendors.

The use of deuterated acids in the diffusion process is beneficial for providing stability and immobility to the crystal lattice structure. The deuterium atom has an additional neutron in the presence of a hydrogen atom, and has a mass approximately twice that of a normal hydrogen atom. Since deuterium ions are heavier they possess higher activation energies and pose a lesser likelihood of moving out of the binding site than do the lighter hydrogen ions. Additionally, deuterium ions are closer in size to the lithium atoms than hydrogen ions. Individual protons (H$^+$) which differ in size and valence number from the replaced lithium atoms, have a tendency to impart more mobility to the crystal lattice. As a result of this mobility, the optical waveguides and the refractive index tend to drift over time, which alters the output intensity of the waveguide. However, when deuterium ions diffuse into the lithium niobate crystal structure and replace lithium atoms they tend to "lock down" in the crystal lattice and provide for more overall stability in the lattice. Note that tritium (H$^3$) could advantageously be used instead of deuterium (H$^2$) and should be considered as equivalent. Due to military restrictions, however, tritium is not widely commercially available in significant quantities.

The first initial diffusion occurs with ions replacing up to about 50% of the lithium atoms in the initial exchange region 20. The depth of the initial ion diffusion region 20 will be dependant upon the cut of the crystal, the optical wavelength and whether the waveguide is single-mode or multi-mode. For an optical modulator having Z-cut LiNbO$_3$ crystal, a single mode and an optical wavelength of 1300 nanometers, the initial ion exchange region 20 is typically about 0.4 microns in depth. The initial diffusion can be accomplished by immersing the modulator build 10 in a vented ion exchange chamber having the appropriate acid at the desired temperature. In general the ion exchange chamber will have the acid held at a temperature between about 160 degrees Celsius and about 240 degrees Celsius. The diffusion soak time will last from about 5 minutes to about 270 minutes. The temperature and time of the initial diffusion process will be dependant upon the acid used and the ability to achieve about 35% to about 50% lithium exchange to a depth of about 0.4 microns in LiNbO$_3$ crystal substrate 12. The diffusion coefficient will vary dependant upon the pH of the acid used, the temperature of the acid bath and the duration of the diffusion soak.

Note that after initial ion exchange and prior to anneal the percentage of Lithium atoms in the waveguide area exchanged for deuterons will be on the order of about 50%. After anneal the percentage will be lowered to about 12% but cover a larger volume. Note that beneficial effects occur with concentrations of deuterons in excess of about 1%.

A more complete discussion of how diffusion depths and percentages are calculated in relation to time, temperature and pH is omitted from this disclosure in order to avoid overcomplicating the disclosure. See, for example, co-pending U.S. patent application Ser. No. 09/157,652 filed on Sep. 21, 1998, in the name of inventor Lee J. Burrows, entitled "Articles Useful as Optical Waveguides and Method for Manufacturing Same" for a disclosure of an appropriate discussion of calculating diffusion depths and percentages. That disclosure is hereby expressly incorporated herein by reference as if set forth fully herein.

Once the initial diffusion process is completed, the photoresist layer 16 and the mask layer 14 may be removed by subjecting modulator build 10 to a suitable stripping procedure. A suitable stripping process may be accomplished with techniques well known in the art such as oxygen plasma etching or by using an acetone wash. The use of acids for stripping purposes should be avoided as they have a tendency to introduce free protons into the modulator construct and these free protons increase the likelihood of latent drift in the modulators. This stripping procedure may be performed after the initial diffusion soak or after the subsequent anneal process. After the initial diffusion soak or, if warranted, after the photo resist stripping process residual acids may be washed off with a suitable solvent such as propenyl or acetone.

Figure 1E:
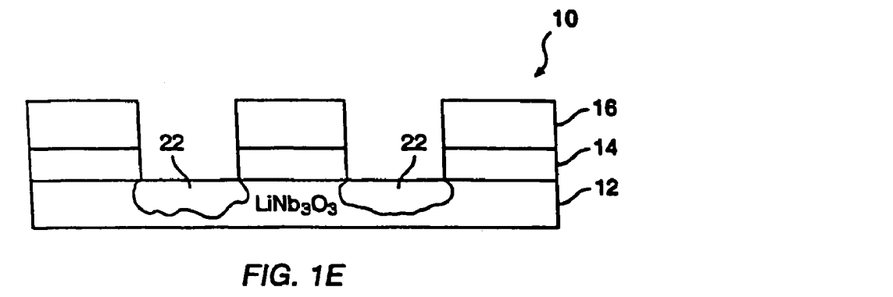

Following the initial diffusion process the waveguide undergoes a pressurized anneal process that serves to further diffuse the ion exchange and drive the ions into greater depths within $LiNbO_3$ crystal substrate 12. As shown in FIG. 1E, the resulting pressurized anneal process will result in the ions having an ion exchange region 22 with a penetration depth of about 6 microns and less than or equal to about 12% of the lithium atoms in ion exchange region 22 will have been replaced with ions. The resulting ion exchange region 22 has one or more refractive indices that differ from the refractive index of the untreated $LiNbO_3$ crystal substrate 12. Preferably ion exchange region 22 exhibits no decrease to a slight increase in extraordinary refractive index relative to the bulk of the untreated $LiNbO_3$ crystal substrate 12. Ion exchange region 22 is capable of constraining a propagating wave such that the wave propagates through ion exchange region 22 and is not scattered or diffused through the bulk of the untreated $LiNbO_3$ crystal substrate 12. Preferably modulator build 10 exhibits the property of allowing a wave propagating through the build to be modulated by an external force.

In accordance with another embodiment of the present invention, prior to the anneal process the modulator build 10 may be placed in a container that allows for lithium niobate powder to be placed in close proximity to lithium niobate substrate 12. Within the container the modulator build 10 and the lithium niobate powder are isolated by a porous interface that allows gas to flow between the lithium niobate structure and the lithium niobate powder but does not allow for the lithium niobate powder to contaminate modulator build 10. The container is closed by slip fit caps that allow for oxygen gas to enter into the container when a pressure differential exists yet restricts the outward flow of lithium oxide ($Li_2O$) in the absence of a pressure differential.

The purpose of the lithium niobate powder is to induce lithium oxide ($Li_2O$) outgassing in the lithium powder during the anneal process while retarding the same outgassing in $LiNbO_3$ crystal substrate 12. As previously discussed lithium niobate will outgas $Li_2O$ when exposed to temperatures in excess of 300 degrees Celsius. The outgassing leads to a lithium niobate substrate that is poor in lithium. Lithium poor structures are prone to the $LiNb_3O_8$ phase forming in the crystal. The $LiNb_3O_8$ phase is not optically transparent and causes high losses in waveguides. The lithium niobate powder has a much larger surface area being a collection of granules rather than a monolithic structure and is generally more reactive than $LiNbO_3$ crystal substrate 12; therefore outgassing will occur more readily in the lithium niobate powder. Once the anneal environment is saturated with $Li_2O$ outgassed from the powder, $LiNbO_3$ crystal substrate 12 is less likely to outgas $Li_2O$.

Figure 2A:
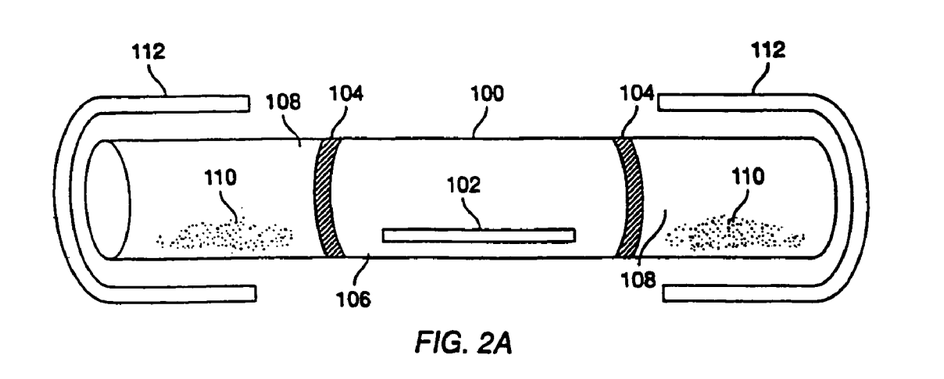
FIG. 2A is a cross-sectional view of a container used for annealing lithium niobate structures in an environment having lithium niobate powder in accordance with one embodiment of the present invention.

Shown in FIG. 2A is a cross-sectional illustration of such an annealing container 100 having both a modulator build and lithium niobate powder contained within. This illustration is shown by way of example, other containers that meet this intent and purpose are also feasible and within the inventive concepts herein disclosed. The container 100 is a tube-like structure that may be fabricated from a high temperature ceramic material such as aluminum oxide ($Al_2O_3$). The modulator build 102 is placed in the center region of the tube and two porous plugs 104 are positioned within the tube a short distance from the tube endings. The porous plugs 104 may comprise any high-temperature material such as $Al_2O_3$ or a similar material. By way of example, the porosity of porous plugs 104 may be defined by the material having a plurality of holes of diameter on the order of about 20 microns. Plugs 104 allow for the relatively free flow of $O_2$ and $Li_2O$ gases between the chamber 106 housing the $LiNbO_3$ crystal and the chamber(s) 108 housing the lithium niobate powder. Once the plugs 104 are positioned within the container 100, lithium niobate powder 110 is placed in one end or both ends of the plugged container 100. The amount of lithium niobate powder used will be dependant on the internal area of the sealable container. By way of example, the amount of the lithium niobate powder may be 2.5 grams for a tube having a volume of about 1.0 $in^3$ to about 2.0 $in^3$. Once the lithium niobate powder 110 has been properly positioned in the tube, the tube is capped at both ends with loose slip fit caps 112 that are typically formed from the same high temperature material as container 100. Slip fit caps 112 will allow oxygen gas to enter container 100 when a pressure differential exists yet restrict the outward flow of $Li_2O$ during the anneal process when the environment is pressure normalized (i.e. no significant pressure gradient exists).

Additionally, other anneal containers can also be configured. For example, an anneal container having one chamber or region for containing modulator build 102, a second region containing lithium niobate powder 110 and a porous wall or plug 104 separating the two regions is also feasible and within the inventive concepts herein disclosed.

Figure 2B:
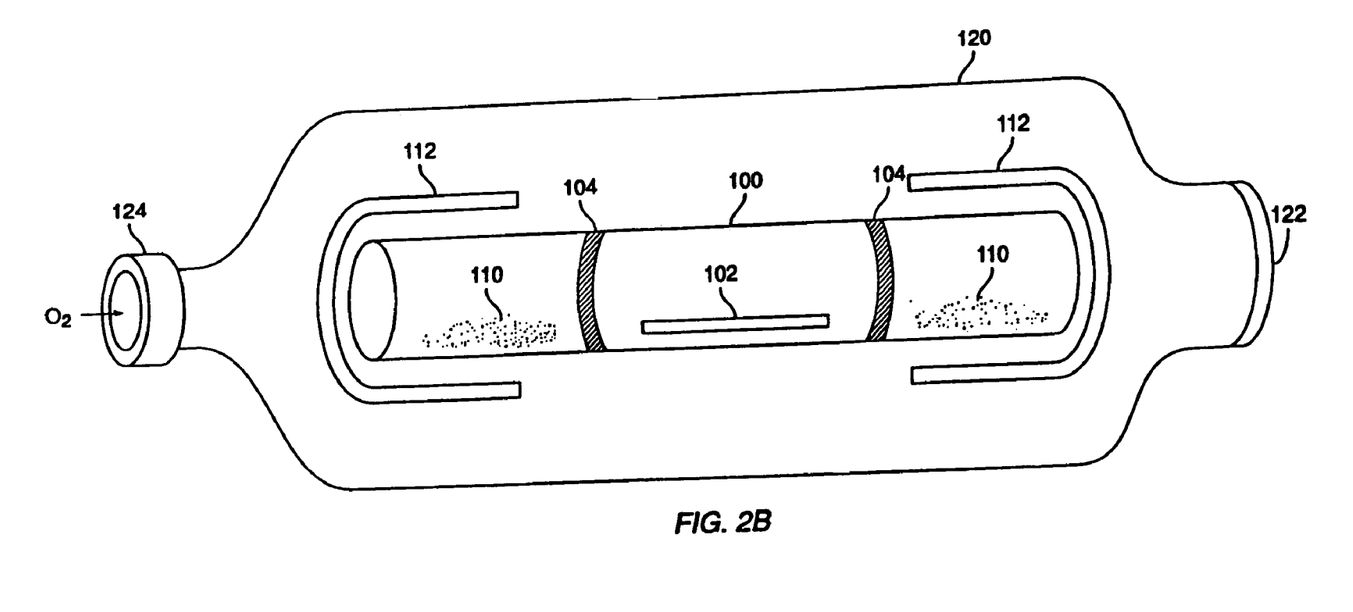
FIG. 2B is a cross-sectional view of a pressurizable vessel used for annealing lithium niobate in accordance with one embodiment of the present invention.

Once the container of FIG. 2A is properly assembled it can be placed within a sealable and pressurizable vessel 120. A cross-sectional view of such a vessel is shown in FIG. 2B, enclosing the container 100 of FIG. 2A. The pressurizable vessel 120 is typically formed from a metal material such as stainless steel or a quartz or ceramic tube with pressure fittings on it. In this illustration vessel 120 is tube-like in structure and has fittings 122 and 124 at opposite ends of vessel 120. Fitting 122 is a fixed fitting and fitting 124 allows for vessel 120 to be vacuum pumped and pressurized with oxygen gas.

Additionally, annealing with lithium niobate powder can be undertaken without the use of the container, such as the one shown in FIG. 2A. It is also possible and within the inventive concept herein disclosed to place the lithium niobate powder directly in pressurized vessel 120. However, the quantity of required lithium niobate powder increases substantially when the powder is placed directly inside the pressurized vessel, making this alternate embodiment, in most instances, more costly.

The anneal process begins by placing modulator build 100 in a conventional annealing oven. Any suitable oven can be used as the annealing chamber and the use of such ovens are widely known by those of ordinary skill in the art. It is possible to use an anneal oven that has pressurizing capabilities in which case the use of the separate pressurizable vessel of FIG. 2B would be unnecessary. Upon placing the lithium niobate structure into the oven, the oven or pressurizable vessel is sealed and then the oven or pressurizable vessel is vacuum pumped down to approximately 100 microns pressure or less to eliminate contaminants from the annealing environment. The vacuum pump down procedure is optional and in some instances the need to remove contaminants from the annealing environment may not be of concern. If the slip fit caps 112 do not make a good seal to the container 100 or if the plugs 104 do not make a good fit with the inside of container 100, creating a pressure differential across them may have the undesirable result of causing turbulence which deposits some powder 110 on chip 102. To avoid this, the vacuum step may be avoided and pressurized gas blown through the oven from port 124 (FIG. 2B) to port 122 (FIG. 2B) to eliminate most important contaminants without causing movement of powder 110. Once the oven or pressurizable vessel has been sealed and optionally vacuumed it is then pressurized with oxygen gas ($O_2$). This oxygen need not be particularly pure and industrial or cutting grade oxygen as used with acetylene torches will suffice. The pressurized oxygen atmosphere serves to prevent oxygen outgassing. It should be noted that the atmosphere is a pure oxygen gas environment, no $H_2O$ is present- and thus no free protons or other radicals are given off that would adversely affect the $LiNbO_3$. The pressure in the $O_2$ atmosphere may be raised to just above ambient atmospheric pressure to about 250 psi above ambient atmospheric pressure. An optimal anneal pressure range is from about 1 psi to about 25 psi above ambient atmospheric pressure, preferably about 6 psi above ambient atmospheric pressure. Applications have shown that annealing at pressures above 25 psi tends to cause the $LiNbO_3$ to turn green in color. While the green discoloration does not appear to affect the structure negatively, to avoid this discoloration pressures below 25 psi above ambient atmospheric pressure should be used.

While oxygen ($O_2$) is presently preferred and provides the best results, the following gasses may also be used with slight reduction in performance: Nitrogen ($N_2$), Argon (Ar), Helium (He). Purities on these gasses may also be the same as for $O_2$, i.e., industrial purities.

Once the oxygen pressurization has been implemented in the anneal chamber the temperature in the oven is then raised to the appropriate level that affects the necessary degree of ion exchange or stress relief desired. In general, the temperature can be raised to about 100 degrees Celsius to about 600 degrees Celsius. A temperature of about 300 degrees Celsius will generally allow for the necessary further ion diffusion into required depths of the lithium niobate crystal substrate. Temperatures above 1000 degrees Celsius are generally undesirable because they allow for further undesirable phase changes to occur in the $LiNbO_3$ crystal. A preferable anneal temperature is about 300 degrees Celsius. It is generally advisable to anneal at lower temperatures to control the depth of ion exchange. However, higher temperature anneals at this stage can be conducted and would decrease the anneal time accordingly. The ramp up rate for elevating the temperature in the oven may be in the range of about 0.5 degrees Celsius per minute to about 20.0 degrees Celsius per minute. The preferred ramp up rate is 10 degrees Celsius per minute.

The required duration of the anneal process will depend upon the temperature at which the annealing takes place. For a higher temperature anneal process a shorter anneal period is required and for a lower temperature anneal process a longer anneal period is required. The anneal period is measured from the time at which the desired elevated temperature is reached. In general, the anneal process will last from about 4 hours to about 8 hours. Longer anneal times are possible but are not commercially acceptable. Shorter anneal times are possible but will require higher anneal temperatures. The desired elevated temperature and elevated pressure should be maintained throughout the duration of the anneal process. Preferably the anneal process will last approximately 6 hours.

The anneal process is completed by cooling the lithium niobate structure in a rapid manner. The ramp down rate for the crystal structure may be from about 0.5 degrees Celsius per minute to about 40 degrees Celsius per minute. A presently preferable ramp down rate for the crystal structure is 20 degrees Celsius per minute. A 20 degrees per minute ramp down rate can be achieved by opening the anneal oven to a room environment while continuing to blow oxygen across the surface of modulator build. Faster ramp down rates decrease the likelihood of $LiNb_3O_8$ forming during the cool down process.

As shown in FIG. 1E, the resulting presently preferred pressurized anneal process will result in the ions having an ion exchange region 22 with a penetration depth of about 6 microns and less than or equal to about 12% of the lithium atoms in ion exchange region 22 will have been replaced with ions.

Figure 1F:
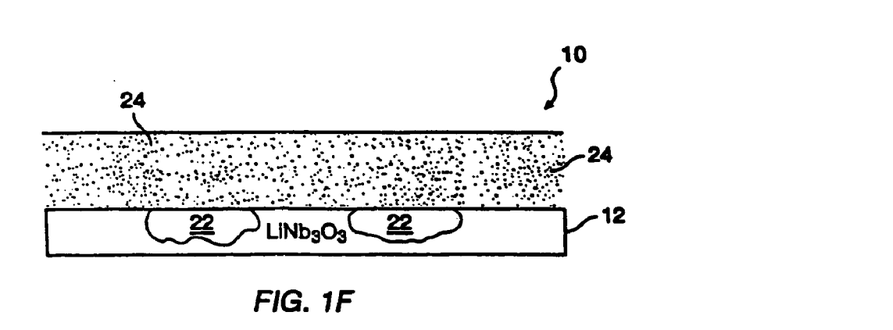

As shown in FIG. 1F, once the secondary anneal process is completed and after a strip operation has removed mask layer 14 and photo resist layer 16, a buffer layer 24 is placed over the entire modulator build 10. Buffer layer 24 serves as insulation and is generally about 500 to about 10000 angstroms in thickness, preferably about 3000 angstroms. Buffer layer 24 may comprise silicon oxide ($SiO_2$, silicon nitride ($Si_3N_4$ or other phases), a combination of silicon oxide and silicon nitride, indium tin oxide (ITO) or another suitable insulator material. Prior to placing buffer layer 24 over the waveguides and the crystal substrate a strip operation may be employed to remove the waveguide template (i.e. mask layer 14 and buffer layer 16). The strip operation can be accomplished using an oxygen plasma, an acetone wash, PVD etch or another suitable technique that does not introduce the use of acids into the fabrication process. A conventional deposition technique, such as sputtering, may be used to place buffer layer 24 over modulator build 10. It should be noted that the use chemical vapor deposition (CVD) techniques should be avoided as such processing tends to generate undesirable free protons.

Figure 1G:
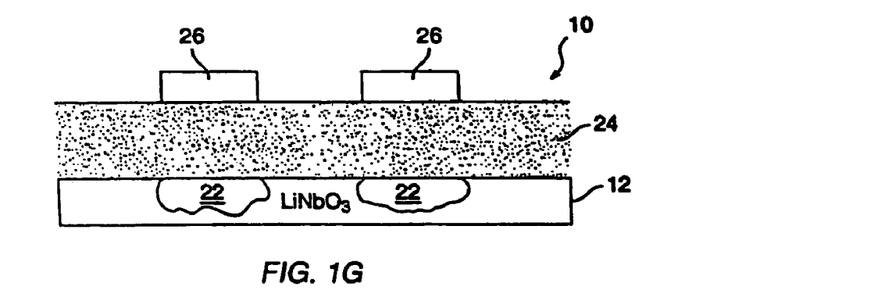

Referring to FIG. 1G, the modulator build 10 is completed by placing electrodes 26 above the buffer layer 24. As shown, electrodes 26 can be placed directly above waveguide regions 22 or they may be placed at other locations atop buffer layer 24. As is known by those of ordinary skill in the art, Z orientation modulators will have electrodes formed directly above the waveguides and X or Y orientation modulators will have electrodes formed offset from the waveguides. Standard deposition techniques are used to form electrodes 26 above buffer layer 24. A standard deposition technique may include a photoresist process, a conventional plasma deposition, sputtering or thermal evaporation process, a plasma etch process and a strip and acetone or propenyl wash process to eliminate the photoresist. The electrodes may be formed from gold (Au), chromium gold, titanium and gold or other suitable electrode materials. The use of chromium and titanium in combination with gold or as a pure thin layer between buffer layer 24 and electrode 26 is for the purpose of increasing adhesion between the gold and the buffer layer.

Once the electrodes have been fabricated the modulator build 10 undergoes a post build anneal process to relieve stress in the crystal, the electrodes and/or the buffer layer. In some instances, this anneal process may also preferably be performed after the formation of buffer layer 24. This pressurized anneal process is referred to as the primary anneal process that all modulator builds undertake as part of standard modulator fabrication. Lithium niobate has inherently high stress coefficients and relieving stress is essential to assure that output drift does not occur in the modulators. This pressurized anneal process has been discussed in detail above. The preferred anneal temperature is about 300 degrees Celsius. The preferred anneal atmosphere is oxygen ($O_2$) at about 6 psi above ambient atmospheric pressure although a range of pressure above ambient from about 1 psi to about 25 psi above ambient atmospheric pressure will work. The preferred anneal time is about 4 hours to about 6 hours. The anneal process may incorporate the use of powdered lithium niobate to lessen the likelihood of modulator build 10 outgassing $Li_2O$.

Figure 3:
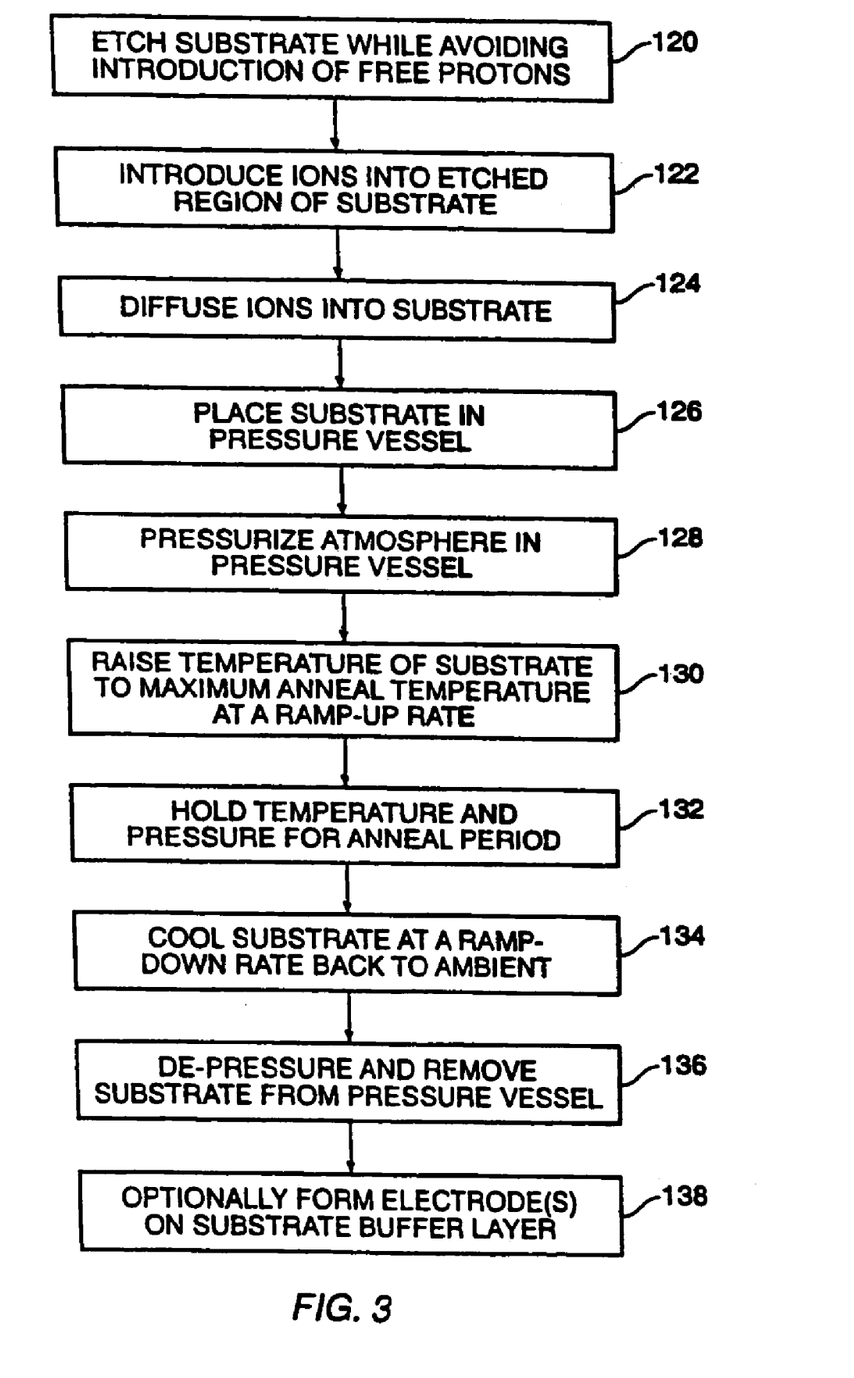
FIG. 3 is a process flow diagram of a process for fabricating structures in accordance with a recently preferred embodiment of the present invention.

FIG. 3 summarizes the fabrication procedures detailed above. At reference number 120 the substrate is etched while avoiding the introduction of free protons. At reference number 122 ions (preferably deuteruted ions) are introduced into the etched regions of the substrate. At reference number 124 the ions are diffused into the substrate. At reference number 126 the substrate is placed into a passive vessel. At reference number 128 the pressure vessel is pressurized (preferable with $O_2$). At reference number 130 the substrate temperature is ramped up to the maximum anneal temperature. At reference number 132 the substrate is held at maximum anneal temperature and pressure for the duration of the anneal period. At reference number 134 the substrate is cooled at a ramp down rate back to ambient. At reference number 136 the vessel is depressurized and the substrate removed. At reference number 138 electrode(s) are optionally formed on the surface of the substrate. An additional anneal procedure may also then be performed.

Alternative Embodiments

Although illustrative presently preferred embodiments and applications of this invention are shown and described herein, many variations and modifications are possible which remain within the concept, scope and spirit of the invention, and these variations would become clear to those skilled in the art after a perusal of this application. The invention, therefore, is not limited except in spirit of the appended claims.

What is claimed is:

1. A method for fabrication of an ion exchange waveguide, the method comprising:
   ion exchanging with a source of ions a lithium niobate ($LiNbO_3$) substrate, said ion exchanging with a source of ions including ion exchanging with a source of deuterium ions; and
   annealing to further diffuse the ion exchange in the lithium niobate substrate by heating in a sealed gas atmosphere to an anneal temperature within a range of about 100 degrees Celsius to about 1000 degrees Celsius, pressurizing the gas atmosphere to exceed ambient atmospheric pressure, maintaining temperature and pressure for an anneal period, and cooling to room temperature after the anneal period.

2. The method of claim 1 wherein the source of deuterium ions is deuterated sulfuric acid.

3. The method of claim 1 wherein the source of deuterium ions is deuterated benzoic acid.

4. The method of claim 1 wherein said ion exchanging further comprises:
   immersing the lithium niobate substrate in an ion exchange bath having a source of ions at an ion exchange temperature of about 160 degrees Celsius to about 240 degrees Celsius; and
   holding the lithium niobate substrate in said ion exchange bath for a period of about 5 minutes to about 270 minutes to effect about 35 percent to about 50 percent alkaline earth metal atom exchange.

5. The method of claim 1 wherein said annealing further comprises heating occurring at a rate within the range of about 0.5 degrees Celsius per minute to about 20 degrees per minute.

6. A method in accordance with claim 1 wherein the anneal temperature is limited to a maximum value within a temperature range of about 100 degrees Celsius to about 600 degrees Celsius.

7. A method in accordance with claim 1 wherein the anneal temperature is limited to a maximum value of about 300 degrees Celsius.

8. The method of claim 1 wherein said pressurizing includes pressurizing the oxygen gas atmosphere to a pressure within a range of about 1 psi above ambient atmospheric pressure to about 25 psi above ambient atmospheric pressure.

9. The method of claim 1 wherein said pressurizing includes pressurizing the oxygen gas atmosphere to a pressure of about 6 psi above ambient atmospheric pressure.

10. The method of claim 1 wherein said cooling includes cooling the substrate at a rate within a range of about 0.5 degrees Celsius per minute to about 40 degrees Celsius per minute.

11. The method of claim 1 wherein said cooling includes cooling the substrate at a rate of about 20 degrees Celsius per minute.

12. The method of claim 1 wherein said annealing of the lithium niobate substrate is performed in an environment comprising lithium niobate powder disposed therein, the lithium niobate substrate being separated from the lithium niobate powder by a barrier, the barrier inhibiting movement of the powder thereacross while permitting a free flow of the gas within the environment.

13. The method of claim 1 wherein said gas is oxygen ($O_2$).

14. The method of claim 1 wherein said gas is one or more gasses selected from the groups consisting of Nitrogen ($N_2$), Argon (Ar), Helium (He) and Oxygen ($O_2$).

15. The method of claim 1, wherein the ions source is a tritium ($H_3$) ion source and said ion exchanging creates a region in the lithium niobate substrate having a crystal lattice structure comprising tritium ions, the region being capable of constraining a propagating wave to the region.

16. The method of claim 1, wherein said ion exchanging creates a region in the lithium niobate substrate having a crystal lattice structure comprising deuterium ions, the region being capable of constraining a propagating wave to the region.

17. A method for fabrication of an ion exchange waveguide, the method comprising:
   ion exchanging with a of ions a lithium tantalate ($LiTaO_3$) substrate, said ion exchanging with a source of ions including ion exchanging with a source of deuterium ions; and
   annealing to further diffuse the ion exchange in the lithium tantalate substrate by heating in a sealed gas atmosphere to an anneal temperature within a range of about 100 degrees Celsius to about 1000 degrees Celsius, pressurizing the gas atmosphere to exceed ambient atmospheric pressure, maintaining temperature and pressure for an anneal period, and cooling to room temperature after the anneal period.

18. The method of claim 17 wherein the source of deuterium ions is deuterated sulfuric acid.

19. The method of claim 17 wherein the source of deuterium ions is deuterated benzoic acid.

20. The method of claim 17 wherein said ion exchanging further comprises: immersing the lithium tantalate substrate in an ion exchange bath having a source of ions at an ion exchange temperature of about 160 degrees Celsius to about 240 degrees Celsius; and holding the lithium tantalate substrate in said ion exchange bath for a period of about 5 minutes to about 270 minutes to effect about 35 percent to about 50 percent alkaline earth metal atom exchange.

21. The method of claim 17 wherein said annealing further comprises heating occurring at a rate within the range of about 0.5 degrees Celsius per minute to about 20.0 degrees per minute.

22. A method in accordance with claim 17 wherein the anneal temperature is limited to a maximum value within a temperature range of about 100 degrees Celsius to about 600 degrees Celsius.

23. A method in accordance with claim 17 wherein the anneal temperature is limited to a maximum value of about 300 degrees Celsius.

24. The method of claim 17 wherein said annealing further comprises pressurizing to within a pressure range of about 1 psi above ambient atmospheric pressure to about 25 psi above ambient atmospheric pressure.

25. The method of claim 17 wherein said pressurizing includes pressurizing the oxygen gas atmosphere to a pressure of about 6 psi above ambient atmospheric pressure.

26. The method of claim 17 wherein said cooling includes cooling the substrate at a rate within a range of about 0.5 degrees Celsius per minute to about 40 degrees Celsius per minute.

27. The method of claim 17 wherein said cooling includes cooling the substrate at a rate of about 20 degrees Celsius per minute.

28. The method of claim 17 wherein said annealing of the lithium tantalate substrate is performed in an environment comprising lithium tantalate powder disposed therein, the lithium tantalate substrate being separated from the lithium tantalate powder by a barrier, the barrier inhibiting movement of the powder thereacross while permitting a free flow of the gas within the environment.

29. The method of claim 17 wherein said gas is oxygen ($O_2$).

30. The method of claim 17 wherein said gas is one or more gasses selected from the groups consisting of Nitrogen ($N_2$)' Argon (Ar), Helium (He) and Oxygen ($O_2$).

31. The method of claim 17, wherein the ions source is a tritium ($H_3$) ion source and said ion exchanging creates a region in the lithium tantalate substrate having a crystal lattice structure comprising tritium ions, the region being capable of constraining a propagating wave to the region.

32. The method of claim 17, wherein said ion exchanging creates a region in the lithium tantalate substrate having a crystal lattice structure comprising deuterium ions, the region being capable of constraining a propagating wave to the region.

33. A method for fabrication of an ion exchange waveguide, the method comprising:

ion exchanging a crystalline substrate with a source of ions, the crystalline substrate being a composition having the formula $RMO_3$ where R is an alkaline earth metal, M is a Group IVB or Group VB metal and O is oxygen; and annealing to further diffuse the ions in the crystalline substrate by heating the crystalline substrate in a sealed gas atmosphere to a maximum anneal temperature, pressurizing the sealed gas atmosphere to exceed ambient atmospheric pressure, maintaining temperature and pressure for an anneal period, and cooling the substrate to ambient temperature.

34. A method in accordance with claim 33 wherein the maximum anneal temperature is in a range of about 100° C. to about 1000°.

35. The method of claim 33 wherein said ion exchanging is accomplished with a source of deuterium ions.

36. The method of claim 35 wherein the source of deuterium ions is deuterated sulfuric acid.

37. The method of claim 35 wherein the source of deuterium ions is deuterated benzoic acid.

38. The method of claim 35, wherein said ion exchanging creates a region in the crystalline substrate having a crystal lattice structure comprising deuterium ions, the region being capable of constraining a propagating wave to the region.

39. The method of claim 33 wherein said ion exchanging further comprises: immersing the crystalline substrate in an ion exchange bath having a source of ions at an ion exchange temperature in a range of about 160 degrees Celsius to about 240 degrees Celsius; and holding the crystalline substrate in said ion exchange bath for a period in a range of about 5 minutes to about 270 minutes to effect about 35 percent to about 50 percent alkaline earth metal atom exchange.

40. The method of claim 33 wherein said heating further comprises heating the substrate to the maximum anneal temperature at a rate within a range of about 0.5 degrees Celsius per minute to about 20.0 degrees per minute.

41. The method of claim 33 wherein said maximum anneal temperature is within a temperature range of about 300 degrees Celsius to about 600 degrees Celsius.

42. The method of claim 33 wherein said maximum anneal temperature is about 300 degrees Celsius.

43. The method of claim 33 wherein said pressurizing includes pressurizing the sealed atmosphere to a pressure within a range of about 1 psi above ambient atmospheric pressure to about 25 psi above ambient atmospheric pressure.

44. The method of claim 33 wherein said pressurizing includes pressurizing the sealed atmosphere to a pressure of about 6 psi above ambient atmospheric pressure.

45. The method of claim 33 wherein said cooling includes cooling the substrate from the maximum anneal temperature at a rate in a range of about 0.5 degrees Celsius per minute' to about 40 degrees Celsius per minute.

46. The method of claim 33 wherein said cooling includes cooling the substrate from the maximum anneal temperature at a rate of about 20 degrees Celsius per minute.

47. The method of claim 33 wherein said annealing of the crystalline substrate is performed in an environment comprising a powder formed of $RMO_3$ disposed therein, the crystalline substrate being separated from the powder by a barrier, the barrier inhibiting movement of the powder thereacross while permitting a free flow of the gas within the environment.

48. The method of claim 33 wherein said gas is oxygen ($O_2$).

49. The method of claim 33 wherein said gas is one or more gasses selected from the groups consisting of Nitrogen ($N_2$), Argon (Ar), Helium (He) and Oxygen ($O_2$).

50. The method of claim 33, wherein the ions source is a tritium ($H_3$) ion source and said ion exchanging creates a region in the crystalline substrate having a crystal lattice structure comprising tritium ions, the region being capable of constraining a propagating wave to the region.

* * * * *